United States Patent
Steiner et al.

(10) Patent No.: US 11,016,844 B2
(45) Date of Patent: May 25, 2021

(54) ERROR CORRECTION CODE STRUCTURE

(71) Applicant: Toshiba Memory Corporation, Tokyo (JP)

(72) Inventors: Avi Steiner, Kiriat Motzkin (IL); Hanan Weingarten, Herzliya (IL); Meir Nadam-Olegnowicz, Binyamina (IL); Ofir Kanter, Haifa (IL); Amir Nassie, Haifa (IL)

(73) Assignee: Toshiba Memory Corporation, Tokyo (JP)

( * ) Notice: Subject to any disclaimer, the term of this patent is extended or adjusted under 35 U.S.C. 154(b) by 33 days.

(21) Appl. No.: 16/355,559

(22) Filed: Mar. 15, 2019

(65) Prior Publication Data

US 2020/0293400 A1     Sep. 17, 2020

(51) Int. Cl.
*G06F 11/10* (2006.01)
*H03M 13/29* (2006.01)
*G11C 29/52* (2006.01)

(52) U.S. Cl.
CPC ...... *G06F 11/1068* (2013.01); *G06F 11/1004* (2013.01); *G11C 29/52* (2013.01); *H03M 13/2909* (2013.01)

(58) Field of Classification Search
CPC ............ G06F 11/1068; G06F 11/1004; H03M 13/2909; G11C 29/52
See application file for complete search history.

(56) References Cited

U.S. PATENT DOCUMENTS

| 8,335,977 | B2 | 12/2012 | Weingarten et al. |
| 8,341,502 | B2 | 12/2012 | Steiner et al. |
| 8,468,431 | B2 | 6/2013 | Steiner et al. |
| 8,510,639 | B2 | 8/2013 | Steiner et al. |
| 8,621,321 | B2 | 12/2013 | Steiner et al. |
| 8,627,188 | B2 | 1/2014 | Weingarten et al. |
| 8,700,970 | B2 | 4/2014 | Steiner et al. |
| 8,850,296 | B2 | 9/2014 | Weingarten et al. |
| 8,850,297 | B1 | 9/2014 | Steiner et al. |
| 9,252,816 | B1 | 2/2016 | Steiner et al. |
| 9,397,706 | B1 | 7/2016 | Steiner et al. |
| 9,407,291 | B1 | 8/2016 | Weingarten et al. |
| 9,413,491 | B1 | 8/2016 | Sterin |
| 9,542,262 | B1 | 1/2017 | Bar et al. |

(Continued)

FOREIGN PATENT DOCUMENTS

JP     2002-261628 A     9/2002

OTHER PUBLICATIONS

Laubach, et al., More on Folded BCH FEC, IEEE P802.3ca NGEPON Interim Meeting, 2017, pp. 1-21.

(Continued)

*Primary Examiner* — Thien Nguyen
(74) *Attorney, Agent, or Firm* — Foley & Lardner LLP

(57) ABSTRACT

Various implementations described herein relate to systems and methods for encoding data having input bits to be stored in a non-volatile storage device, including mapping the input bits to a plurality of component codes of an error correction code (ECC) and encoding the input bits as the plurality of component codes, wherein first input bits of the input bits encoded by any of the plurality of component codes are encoded by every other component code of the plurality of component codes in a non-overlapping manner.

20 Claims, 4 Drawing Sheets

(56) References Cited

U.S. PATENT DOCUMENTS

| | | | |
|---|---|---|---|
| 9,584,159 B1 | | 2/2017 | Weingarten et al. |
| 2003/0046067 A1 | * | 3/2003 | Gradl ..................... G10L 19/12 704/217 |
| 2004/0128607 A1 | * | 7/2004 | Sutskover .......... H03M 13/1182 714/759 |
| 2011/0246863 A1 | | 10/2011 | Miyauchi et al. |
| 2012/0210189 A1 | * | 8/2012 | Sugihara ............... H03M 13/35 714/752 |
| 2012/0240008 A1 | * | 9/2012 | Obata .................. H03M 13/118 714/758 |
| 2016/0094246 A1 | * | 3/2016 | Vasista Srinivasan Ranganathan ..... H03M 13/1171 714/776 |
| 2017/0272101 A1 | * | 9/2017 | Ha ........................ H03M 13/15 |
| 2018/0006667 A1 | | 1/2018 | Motwani |
| 2018/0026661 A1 | * | 1/2018 | Ha ........................ G11C 29/52 714/764 |
| 2018/0226999 A1 | * | 8/2018 | Wang ................ H03M 13/2963 |
| 2019/0165884 A1 | * | 5/2019 | Koike-Akino ........ H03M 13/27 |

OTHER PUBLICATIONS

Foreign Search Report on PCT PCT/IB2020/052323 dated Jul. 7, 2020.

* cited by examiner

ERROR CORRECTION CODE STRUCTURE

TECHNICAL FIELD

The present disclosure relates generally to systems and methods for error correction code (ECC) structures for flash memory devices.

BACKGROUND

Flash memory devices (e.g., NAND flash memory devices) enable page reads based on voltage thresholds of the flash memory devices. Due to different noise (e.g., NAND noise) and interference sources during programming and read, errors on information bits stored in flash memory devices can occur. Such errors may be due to one or more of programming errors, reads with non-optimal thresholds, retention/read-disturb stresses, and so on. A strong ECC can allow fast programming (with possibly high programming errors) and reads under high stress conditions and/or with low-complexity digital signal processing (DSP).

A code rate is defined by a ratio of information content (referred to as a "payload") of a codeword to an overall size of the codeword. For example, for a code that contains k bits and r redundancy bits, the code rate $R_c$ is defined by $R_c = k/k+r$. Conventional encoding methods are not well suited to support codes having high code rates for both hard decoding and soft decoding. For example, conventional low-density parity-check (LDPC) codes that have high code rates (e.g., 0.9) have considerably long code length, resulting in complex and costly implementations.

SUMMARY

In certain aspects, the present implementations are directed to encoding an input payload to be programmed in a non-volatile memory device (e.g., a flash memory device) using of ECC structure having multiple component codes.

DETAILED DESCRIPTION

Figure 1:
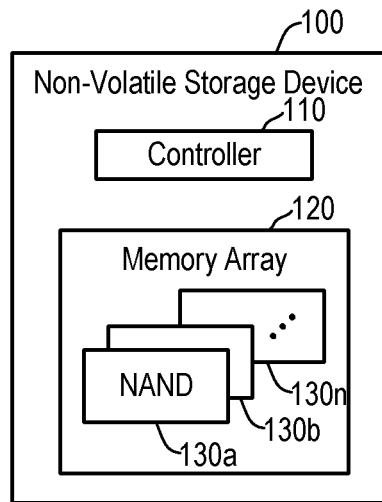
FIG. 1 shows a block diagram of examples of a non-volatile storage device, according to some implementations.

Arrangements disclosed herein relate to systems, apparatuses, methods, and non-transitory computer-readable media for providing flash memory devices (e.g., NAND flash memory devices) with improved endurance and average read performance. The current disclosure relates to an ECC structure that enables correction of high raw bit error rate (RBER) at high performance. In some arrangements, the ECC structure includes a modified half product code, referred to as a half folded-product code (HFPC). As described herein, the ECC structure implementing the HFPC enables high code rates for flash memory devices. In some examples, the ECC encoder/decoder executing the ECC structure described herein can be implemented on a controller hardware and/or firmware. In some examples, the ECC encoder/decoder executing the ECC structure described herein can be implemented on a host software. Low complexity processing can be implemented on the ECC encoder/decoder.

The ECC structure implementing the HFPC and the ECC encoder/decoder executing the ECC structure improve conventional ECC structures and ECC encoders/decoders in various ways. For example, the ECC structure provides high read performance (e.g., high read throughput). In some arrangements, a code construction as described herein is based on simple component codes (such as but not limited to, Bose-Chaudhuri-Hocquenghem (BCH) components) which can be implemented efficiently. The component codes implement iterative decoding. Therefore, the code construction has a more cost-effective implementation as compared to conventional codes (e.g., the LDPC codes) that have complex and costly implementations. This allows the code structure to be suitable for storage applications for flash memory devices (e.g., NAND flash memory devices and controllers thereof).

The simple code components can enable improved encoding/decoding throughput and efficiency with low implementation complexity for both hard input or soft input to the decoder. That is, the ECC structure described herein can provide high error correction capabilities for both hard decoding and soft decoding. For example, the ECC structure can enable high RBER error correction with hard input to the decoder (hard decoding) and can provide high throughput at low implementation complexity. This improves the error correction capabilities of storage systems given that storage systems typically implement a single-read operation. Therefore, high performance on read operations for a storage device can be achieved throughout a lifespan of the storage device. In addition, the ECC structure can enable high RBER error correction with soft input to the decoder (soft decoding), providing high reliability at high program-erase (P/E) cycle counts and in difficult retention conditions, as storage systems typically require a very small uncorrectable bit error rate (UBER) (e.g., 1E-15).

In addition, the ECC structure allows efficient hardware implementation, for instance, by having low power consumption. Furthermore, the ECC structure can be configured to support multiple code rates without compromising reliability, while approximating theoretical bounds for the multiple code rates. Accordingly, the ECC structure can provide a low error floor. The ECC structure enables high endurance and improved resilience to retention and read-disturb stresses.

In some implementations, the code rate of the ECC structure can be configured for each application. For example, a single engine can configure (with firmware) the code parameters to determine the payload size and redundancy size of the ECC in the manner described. This allows using different codes for different type of pages, for example, according to RBER characteristics of the pages. Alternatively, the payload size can be determined in a manner to optimize the tradeoff between performance and reliability.

To assist in illustrating the present implementations, FIG. 1 shows a block diagram of a non-volatile storage device 100 according to some implementations. In some examples, the non-volatile storage device 100 is located in a datacenter (not shown for brevity). The datacenter may include one or more platforms, each of which supports one or more storage devices (such as but not limited to, the non-volatile storage device 100). In some implementations, the storage devices within a platform are connected to a Top of Rack (TOR) switch and can communicate with each other via the TOR switch or another suitable intra-platform communication mechanism. In some implementations, at least one router may facilitate communications among the non-volatile storage devices in different platforms, racks, or cabinets. Examples of the non-volatile storage device 100 include but are not limited to, a solid state drive (SSD), a non-volatile dual in-line memory module (NVDIMM), a Universal Flash Storage (UFS), a Secure Digital (SD) device, and so on.

The non-volatile storage device 100 includes at least a controller 110 and a memory array 120. Other components of the non-volatile storage device 100 are not shown for brevity. As shown, the memory array 120 includes NAND flash memory devices 130a-130n. Each of the NAND flash memory devices 130a-130n includes one or more individual NAND flash dies, which are non-volatile memory (NVM) capable of retaining data without power. Thus, the NAND flash memory devices 130a-130n refer to multiple NAND flash memory devices or dies within the flash memory device 100. Each of the NAND flash memory devices 130a-130n includes a die which has one or more planes. Each plane has multiple blocks, and each block has multiple pages.

While the NAND flash memory devices 130a-130n are shown to be examples of the memory array 120, other examples of non-volatile memory technologies for implementing the memory array 120 include but are not limited to, magnetic random access memory (MRAM), phase change memory (PCM), ferro-electric RAM (FeRAM) or the like. The ECC structure described herein can be likewise implemented on memory systems using such memory technologies.

Examples of the controller 110 include but are not limited to, an SSD controller (e.g., a client SSD controller, a datacenter SSD controller, an enterprise SSD controller, and so on), a UFS controller, or an SD controller, and so on.

The controller 110 can combine raw data storage in the plurality of NAND flash memory devices 130a-130n such that those NAND flash memory devices 130a-130n function as a single storage. The controller 110 can include microcontrollers, buffers, error correction systems, flash translation layer (FTL) and flash interface modules. Such functions can be implemented in hardware, software, and firmware or any combination thereof. In some arrangements, the software/firmware of the controller 110 can be stored in the non-volatile storage 120 or in any other suitable computer readable storage medium.

The controller 110 includes suitable processing and memory capabilities for executing functions described herein, among other functions. As described, the controller 110 manages various features for the NAND flash memory devices 130a-130n including, but not limited to, I/O handling, reading, writing/programming, erasing, monitoring, logging, error handling, garbage collection, wear leveling, logical to physical address mapping, data protection (encryption/decryption), and the like. Thus, the controller 110 provides visibility to the NAND flash memory devices 130a-130n.

The error correction systems of the controller 110 can include or otherwise implement one or more ECC encoders and one or more ECC decoders. The ECC encoders are configured to encode data (e.g., input payload) to be programmed to the non-volatile storage 120 (e.g., to the NAND flash memory devices 130a-130n) using the ECC structures described herein. The ECC decoders are configured to decode the encoded data to correct programming errors, errors caused by reading with non-optimal thresholds, errors caused by retention/read-disturb stresses, and so on.

In some examples, the controller 110 is configured to arrange an input payload in a pseudo triangular matrix form and to perform folded encoding (e.g., folded BCH encoding) for every component code. In some examples, every bit in a payload (e.g., every information bit) can be encoded by (at least) two component codes (also referred to as "code components"), and each component code intersects with all other component codes. That is, for component codes that encode the information bits, the encoding process is performed such that systematic bits of every component code is also encoded by all other component codes. The component codes together provide encoding for every information bit using the component codes.

In some arrangements, the ECC structure uses multi-dimensional encoding. In multi-dimensional encoding, a stream of data is passed through a set of multiple component encoders (implemented or otherwise included by the controller 110) which together encode the full payload into a single codeword. BCH encoding can be performed by passing systematic data of the code through a shift register of the controller 110. Therefore, the systematic data can simply pass through the component encoders of the controller 110 without being modified while the shift-register advances. After the systematic data being completely passed through the shift-register, the content of the shift register is the redundancy of the code and is appended to the data stream. The same characteristics are applicable to all component encoders in all dimensions. Multi-dimensional encoding can be obtained with product codes or symmetric product codes and may provide improved capabilities. Such structures create a product of component codes to obtain a full codeword. As such, the decoding process can include iterative decoding of the component codes.

Figure 2:
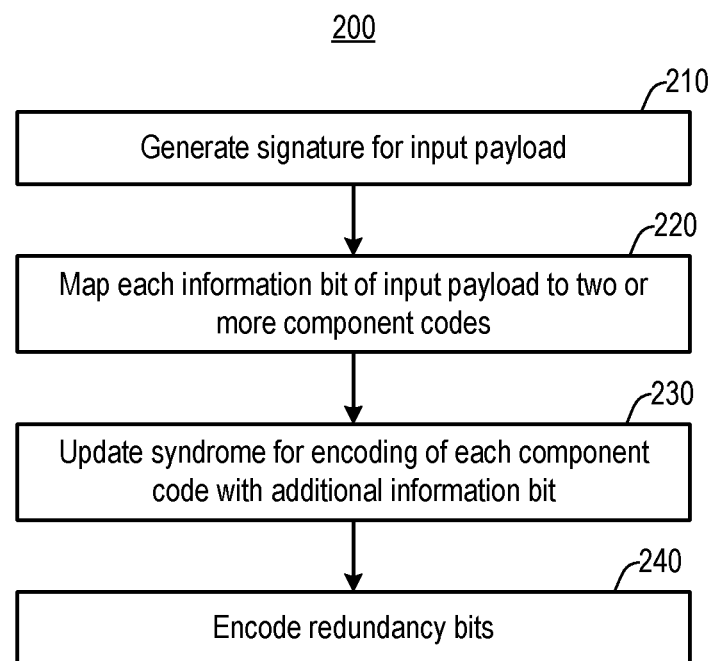
FIG. 2 is a process flow diagram illustrating an example encoding method according to some implementations.

FIG. 2 is a process flow diagram illustrating an example of an encoding method 200 according to some implementations. Referring to FIGS. 1-2, the method 200 encodes an input payload to obtain a corresponding ECC as described herein. The input payload includes information bits.

At 210, the controller 110 generates a signature for the input payload. The signature can be used during decoding to check whether decoding is successful. In some examples, the signature can be generated by passing the information bits through a hash function. In some examples, the signature includes a cyclic redundancy check-sum (CRC) generated from the information bits. In some examples, in addition to the CRC, the signature can include other indications generated from the input payload. The CRC can be generated to have a designated length. The length of the CRC can be determined based on factors such as but not limited to, target misdetection probability of the codeword decoding, misdetection probability of decoding process (alone without the CRC), and so on. Misdetection probability of the codeword decoding refers to the probability of signaling-out a "decode success" despite the existence of decode errors. Misdetection probability of decoding process (alone without the CRC) refers to the probability of signaling-out a "decode failure" despite the absence of decode errors. Some level of confidence for decoding can be provided using the component codes zero syndromes, which in some cases may be sufficient to allow a zero-length CRC. Otherwise, the CRC can be used for a combined misdetection decision. For instance, longer length of the CRC corresponds to a low misdetection probability of the codeword decoding. On the other hand, shorter length of the CRC corresponds to high target misdetection probability of the codeword decoding.

At 220, the controller 110 maps each information bit of the input payload to two or more component codes. In some examples, the bits corresponding to the signature (e.g., the CRC bits) can also encoded (e.g., each CRC bit can be mapped to one or more component codes in the arrangements in which the ECC is a regular HFPC). That is, the controller 110 implements a mapping function that maps each information bit of the input payload with corresponding component codes of the ECC. In the arrangements in which the ECC is a regular HFPC (e.g., FIG. 3), each information bit can be mapped to two component codes (e.g., i1 and i2). In the arrangements in which the ECC is an irregular HFPC (e.g., FIG. 4), at least one information bit can be mapped to three or more component codes, thus creating an irregular encoding process.

Blocks 210 and 220 can be implemented simultaneously or in parallel in some examples. In other examples, blocks 210 and 220 can be implemented sequentially in any suitable order.

The ECC code structure is composed of multiple component codes. Each component code can be, for example, a BCH code. A number of components code n can be determined by the correction capability of each component code and code rate. For example, given a minimum distance $D_{min}$ per component code, the correction capability t of each component code can be represented by:

$$t = (D_{min}-1)/2 \qquad (1).$$

where the $D_{min}$, of a linear block code is defined as the smallest Hamming distance between any pair of code vectors in the code. The number of redundancy bits r can be represented by:

$$r = Q \cdot (D_{min}-1)/2 \qquad (2);$$

where Q is a Galois field parameter for the BCH component code defined over $GF(2^Q)$. Given a code rate R and payload length K bits, a number of component codes needed can be determined by:

$$n = \left\lfloor K \cdot \frac{1-R}{r \cdot R} \right\rfloor; \text{ or} \qquad (3)$$

$$n = \left\lfloor 2K \cdot \frac{1-R}{Q \cdot (D_{min}-1) \cdot R} \right\rfloor. \qquad (4)$$

At 230, the controller 110 updates a syndrome for encoding of each component code with an additional information bit. Thus, every component code encodes a portion of the input payload, depending on the mapping function executed at 220. A set of redundancy bits corresponding to the component codes are generated after all payload bits (including the information bits and the signature bits) are encoded per blocks 210-230.

At 240, the controller 110 encodes the redundancy bits (in an additional encoding process) in some arrangements. That is, the redundancy bits can be mapped to additional code components. For example, the encoding can be obtained by a similar set of component codes. The set of component codes may be a smaller set than a set of the payload encoding set, for example, for higher code rate. Every redundancy encoding component can receive separate redundancy input bits for encoding. As such, a parity of parity encoding is generated.

Figure 3:
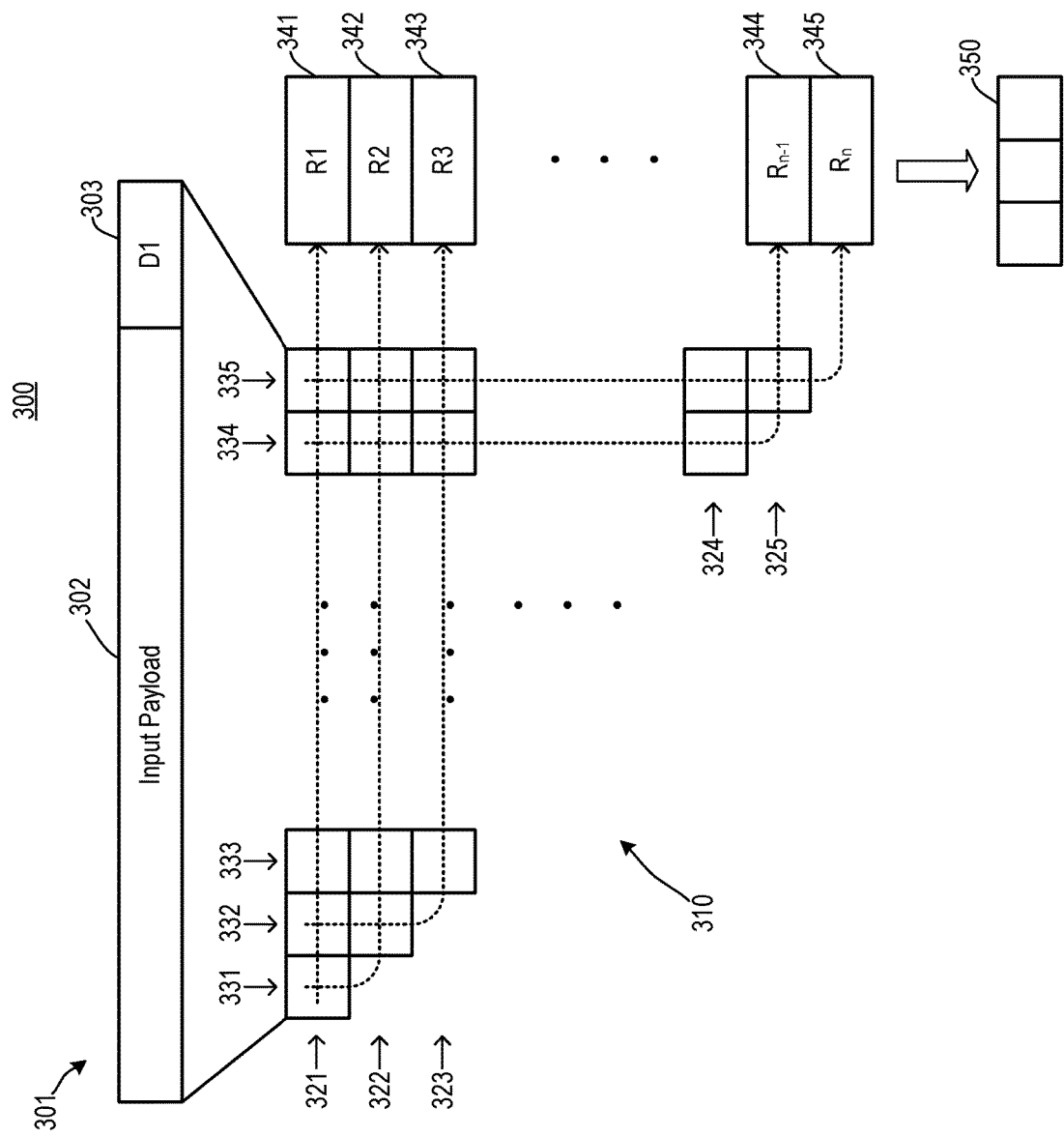
FIG. 3 is a diagram illustrating a mapping in an encoding process using a HFPC structure according to various implementations.

FIG. 3 is a diagram illustrating a mapping 300 in an encoding process using a HFPC structure according to various implementations. Referring to FIGS. 1-3, the mapping 300 corresponds to the HFPC encoding scheme and is an example implementation of block 220. The controller 110 can include or can otherwise implement an HFPC interleaver configured to organize (e.g., interleave or map) input bits 301 into a form of a pseudo triangular matrix 310. The input bits 301 include input payload 302 and signature bit(s) D1 303 in some examples. The input payload 302 includes the information bits. As described, an example of D1 303 is the extra CRC bits. The bits of D1 303 can also be referred to as "outer parity bits," given that CRC encoding can be viewed as an outer encoding process. The mapping from the input bits 301 to the pseudo triangular matrix 310 is maintained by the controller 110.

As shown, the pseudo triangular matrix 310 has an upper triangular form, which has rows 321-325 (with rows between rows 323 and 324 omitted for clarity) and column 331-335 (with columns between columns 333 and 334 omitted for clarity). The pseudo triangular matrix 310 is shown to have multiple blocks. Each block in the pseudo triangular matrix 310 includes or otherwise represents two or more bits of the input bits 301. The number of input bits per each block can be predetermined and equal for all the blocks of the pseudo triangular matrix 310. Therefore, the HFPC is obtained by allowing any pair of component codes to encode (e.g., intersect at) more than one bit. Conventionally, any pair of components HFPC intersect by only one common (intersection) bit. The disclosed implementations allow intersection of two or more common bits for any pair of component codes. The pseudo triangular matrix 310 is "pseudo" given that each row has two or more bits (e.g., a block) more than the row immediately below that row, and each column has two or more bits (e.g., a block) more than the column immediately to its left. Thus, each row or column of the pseudo triangular matrix differs from an adjacent row or column by two or more bits In some implementations, the input bits 301 are mapped to a block in the pseudo triangular matrix 310 consecutively (by any suitable order). For example, the rows 321-325, in that order or in a reverse order, can be filled by the input bits 301 consecutively block by block, from the left-most block of a row to a right-most block of a row, vice versa. In another example, the columns 331-335, in that order or in a reverse order, can be filled by the input bits 301 consecutively block by block, from the top-most block of a column to a bottom-most block of a row, vice versa. In some implementations, the input bits 301 are mapped to the pseudo triangular matrix 310 pseudo-randomly. In other implementations, the input bits 301 can be mapped to the pseudo triangular matrix 310 using another suitable mapping mechanism. In one embodiment, the mapping is a one to one mapping, where each bit of the input bits 301 is mapped to one bit of the pseudo triangular matrix 310 and the total number of bits in the pseudo triangular matrix 310 is equal to the number of input bits 301. In another embodiment, the mapping may be one to many, where each bit of the input bits 301 is mapped to one or more bits of the pseudo triangular matrix 310 and the total number of bits in the pseudo triangular matrix 310 is greater than the number of input bits 301.

As shown, the upper triangular form has a same number of columns and a same number of rows. In the upper triangular form, the row 321 contains the most bits out of all the rows in the pseudo triangular matrix 310. The row 322 has one less block than the row 321. The row 323 has one less block than the row 322, and so on. The row 324 has two blocks, and the row 325, being the lowest row, has one block. In other words, any row in the pseudo triangular matrix 310 (except for the row 321) has one block less than the row immediately above. Similarly, in the upper triangular form, the column 331, being the left-most column, has one block. The column 332 has one more block than the column 331. The column 333 has one more block than the column 332, and so on. The column 335, being the right-most column, has the most blocks out of the columns in the pseudo triangular matrix 310. In other words, any column in the pseudo triangular matrix 310 (except for the column 335) has one block less than the column immediately to the right.

Organizing or mapping the input bits 301 (which includes the bits of the input payload 302 and signature bit(s) D1 303) in the upper triangular form of the pseudo triangular matrix 310 allows every component code to be associated with bits in a row and a column that have the same size or nearly the same size in the manner described. For example, R1 341 represents redundancy bits corresponding to a first component code. R1 341 redundancy bits are obtained by encoding (e.g., folded component encoding) the input bits 301 in a first row (e.g., the bits in the row 321). R2 342 redundancy bits are obtained by encoding (e.g., via folded component encoding) the input bits 301 in a first column (e.g., the bits in the column 331) and the second row (e.g., the bits in the row 322). The number of total bits (e.g., the bits in the column 331 plus the bits in the row 322) encoded by R2 342 are the same as the number of total bits (e.g., the bits in the row 321) encoded by R1 341. R3 343 redundancy bits are obtained by encoding (e.g., via folded component encoding) the input bits 301 in a second column (e.g., the bits in the column 332) and the third row (e.g., the bits in the row 323). The number of total bits (e.g., the bits in the column 332 plus the bits in the row 323) encoded by R3 343 are the same as the number of total bits encoded by R2 342 (as well as the number of total bits encoded by R1 341). This process continues to obtain the last redundancy bits Rn 345, which encodes (e.g., via folded component encoding) the input bits 301 in the last column (e.g., the bits in the column 335). Thus, each component code encodes a row and a column in the pseudo triangular matrix 310, providing folded component encoding. An example of the folded component encoding is folded BCH encoding.

In other words, according to the mapping 300, the input bits 301 are mapped to the component codes of the ECC and are encoded as the mapped component codes. For example, the encoding process organizes or maps the input bits 301 in a matrix (e.g., the pseudo triangular matrix form), and performs folded BCH encoding for every component code. Each of the input bits 301 is encoded by two component codes. Each component code intersects with all other component codes. For component codes that encode the input bits 301, the encoding process is performed such that the systematic bits of every component code is also encoded by all other component codes. The input bits encoded by any of the component codes are also encoded by every other component code in the ECC in a non-overlapping manner. For example, the bits encoded by the component code corresponding to R3 343 redundancy bits are also encoded by other component codes corresponding to R1 341, R2 342, and R4-Rn 345. The bits at intersection of the row 321 and the column 332 are also encoded by the component code corresponding to R1 341; the bits at the intersection of the row 322 and the column 332 are also encoded by the component code corresponding to R2 342; the bits at the intersection of the row 323 and the column 334 are also encoded by the component code corresponding to Rn-1 344; the bits at the intersection of the row 323 and the column 335 are also encoded by the component code corresponding to Rn 345. Each block of bits encoded by any of the component code (e.g., the component code corresponding to the R3 343) is encoded by that component code (e.g., the component code corresponding to the R3 343) and no more than another one of the component codes, hence in a non-overlapping manner. As such, every component code is mutually dependent on all other component codes. The component codes together provide the encoding of each of the input bits 301 using two component codes. The component codes have the same code rate given that each component code encodes a same number of bits.

In some implementations, parity bits can be generated via parity encoding. For example, folded parity encoding can be used to encode at least a portion of each of R1 341-Rn 345 into another component code (e.g., a folded product code 350, which is a set of packets). The folded product code 350 is comprised of the parity bits. This method of generating the parity bits can be efficient for obtaining simple hardware encoding implementations of HFPC, as the method can be iteratively decoded using various methods of hard or soft decoding.

In some examples, to provide an efficient structure, an incomplete portion (e.g., not an entirety) of each of R1 341-Rn 345 is encoded to obtain the folded product code 350. This is because only the encoded versions of the input bits 301 (e.g., the input payload 302) needs to be decoded—decoding all of the redundancy bits R1 341-Rn 345 may prolong decoding time.

Figure 4:
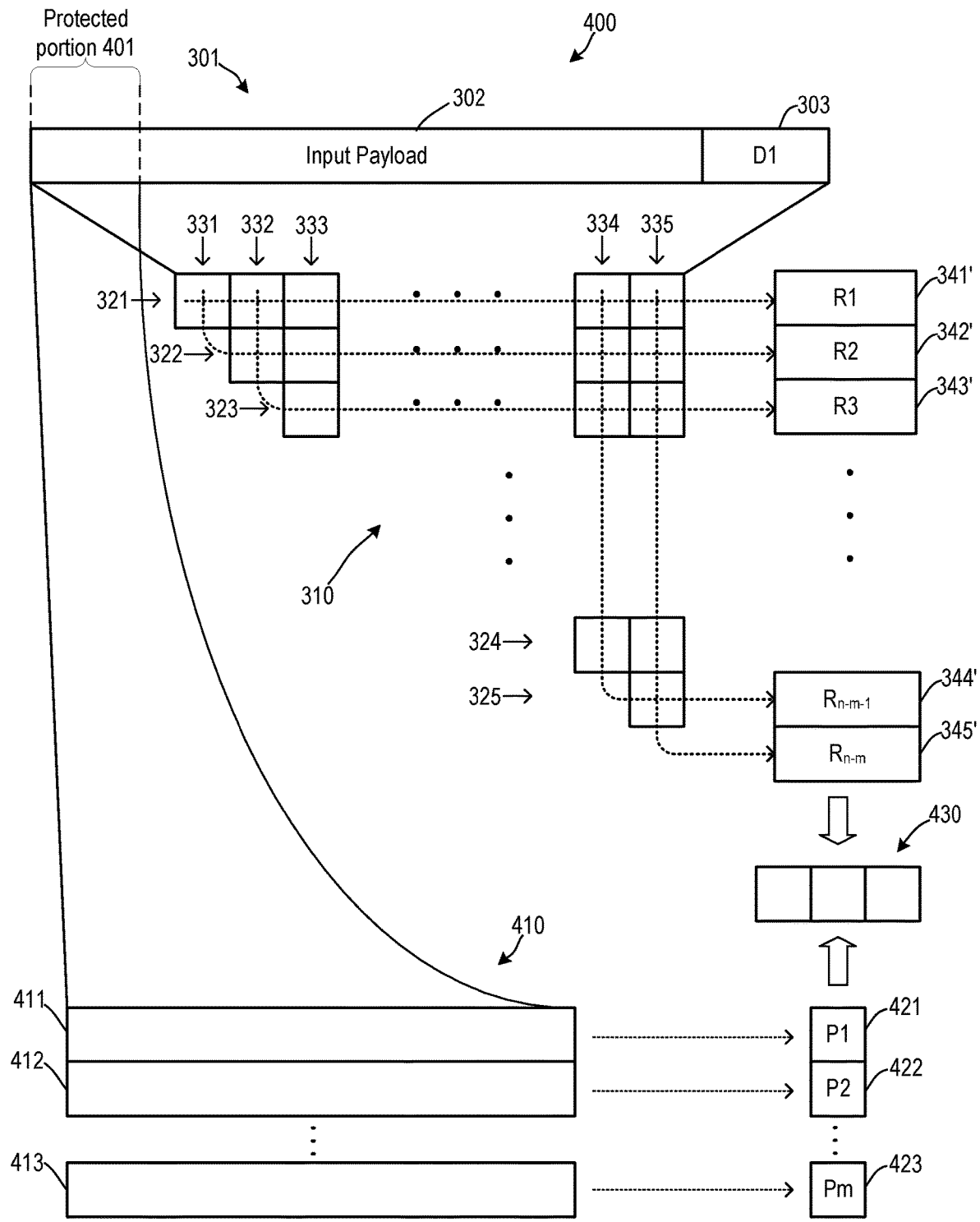
FIG. 4 is a diagram illustrating a mapping in an encoding process using an irregular HFPC structure according to various implementations.

In some arrangements, the degree of protection for some information bits can be more than two by leveraging irregular half folded-product code encoding. For example, in addition to encoding the regular half folded-product code as described with reference to FIG. 3, an additional encoding process can be applied to some of the input bits 301 by encoding those bits with a different set of component codes. In some examples, the irregularity of the encoding process is caused by some of the input bits 301 being encoded by more than two component codes while other bits of the input bits 301 are encoded by two component codes, creating an unequal error protection of the bits within the codeword and resulting in improved correction capabilities (as applied to iterative decoding). In that regard, FIG. 4 is a diagram illustrating a mapping 400 in an encoding process using an irregular HFPC structure according to various implementations.

Referring to FIGS. 1-4, the mapping 400 corresponds to the irregular HFPC encoding scheme and is an example implementation of block 220. The controller 110 can include or can otherwise implement an HFPC interleaver configured to organize (e.g., interleave or map) the input bits 301 into the pseudo triangular matrix 310 as described in connection with FIG. 4. Redundancy bits R1 341', R2 342', R3 343', . . . , Rn-m-1 344', and Rn-m 345' are generated in a manner similar to that by which R1 341-Rn 345 are generated per FIG. 3. For example, the last redundancy bits Rn-m 345', which encodes (e.g., via folded component encoding) the input bits 301 in the last column (e.g., the bits in the column 335).

In some examples, the input bits 301 include a protected portion 401 (a "3D protected payload part"). The protected portion 401 contains one or more bits can be any part of the input bits 301 that may need additional error correction protection (e.g., the protected portion 401 is known to be prone to errors).

The redundancy bits R1 341'-Rn-m 345' generated from the HFPC encoding process described with respect to FIG. 3 can be encoded by another, separate set of component codes used to encode all or a subset of these redundancy bits by another set of code components. The protected portion 401 can be encoded (in addition to being encoded based on the pseudo triangular matrix 310 as described) using a separate set of component codes. As shown, the protected portion 401 can be encoded using a mapping 410 different from the HFPC mapping of the pseudo triangular matrix 310 to create bits 411, 412, . . . , 413 (the bits between 412 and 413 are omitted for brevity). The mapping 410 creates m sets of redundancy bits P1 421, P2 422, . . . , Pm 423.

Thus, the bits in the protect portion 401 can be protected by three component codes—two based on the HFPC mapping of the pseudo triangular matrix 310 and another based on the mapping process 410. This additional mapping process 410 thus provides added protection of the protected portion 401, providing an improved starting capability of iterative decoding processes, leading to higher decoding capabilities, and resulting in a low-complexity encoding process.

In some implementations, parity bits (e.g., a folded product code 430) can be generated via parity encoding. For example, folded parity encoding can be used to encode at least a portion of each of R1 341'-Rn-m 345' and at least a portion of each of P1 421-Pm 423 into another component code (e.g., the folded product code 430, which is a set of packets). For example, the component code obtained by using folded parity encoding of at least a portion of each of R1 341'-Rn-m 345' may be added to the component code obtained by using folded parity encoding of at least a portion of each of R1 341'-Rn-m 345' to generate the folded product code 430.

As shown, the bits for each component code depend on the bits for another component code during decoding in the ECC structure corresponding to the mappings 300 and 400. In other implementations, multiple component codes can be grouped together and function like a single element according to the HFPC structures such that no dependency exists among the bits of the component codes within each group of component codes. Such encoding scheme reduces dependency of the HFPC structure and enables faster decoding implementation in hardware given that the encoding scheme is a low-complexity encoding and decoding code structure obtained by defining groups, where each group includes independent components.

Figure 5:
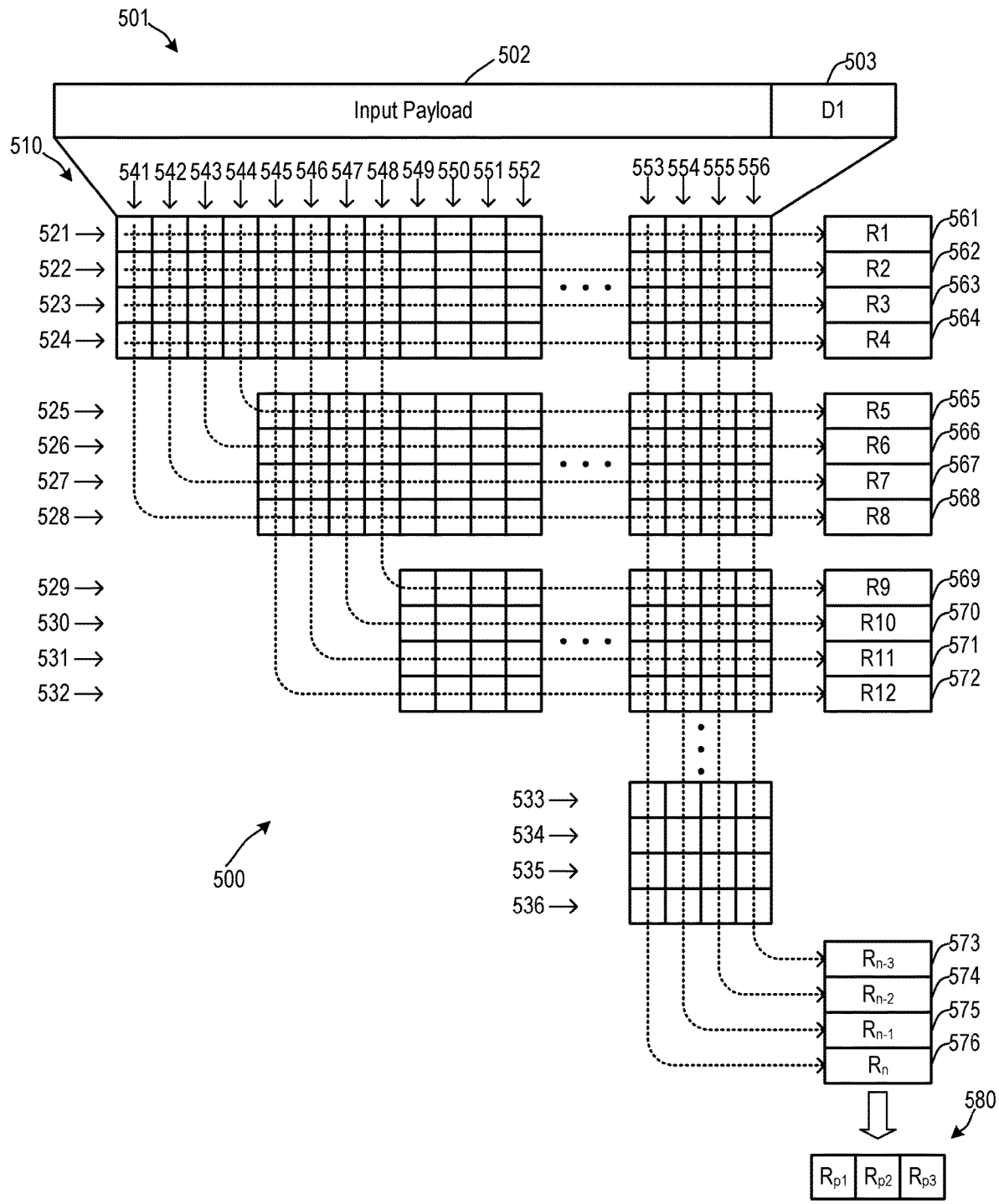
FIG. 5 is a diagram illustrating a mapping in an encoding process using a group HFPC structure according to various implementations.

In that regard, FIG. 5 is a diagram illustrating a mapping 500 in an encoding process using a group HFPC structure according to various implementations. Referring to FIGS. 1-5, the mapping 500 corresponds to the group HFPC encoding scheme and is an example implementation of block 220. The HFPC interleaver of the controller 110 is configured to organize (e.g., interleave) input bits 501 into a form of a pseudo triangular matrix 510. The input bits 501 includes input payload 502 and signature bit(s) D1 503 in some examples. The input payload 502 includes the information bits. As described, an example of D1 503 is the extra CRC bits (outer parity bits). The mapping from the input bits 501 to the pseudo triangular matrix 510 is maintained by the controller 110.

As shown, the pseudo triangular matrix 510 has an upper triangular form, which has rows 521-536 (with rows between rows 532 and 533 omitted for clarity) and columns 541-556 (with columns between columns 552 and 553 omitted for clarity). The pseudo triangular matrix 510 is shown to have multiple blocks. Each block in the pseudo triangular matrix 510 includes or otherwise represents two or more bits of the input bits 501. The number of input bits per each block can be predetermined and equal for all the blocks of the pseudo triangular matrix 510. The disclosed implementations allow intersection of two or more common bits for any pair of component codes.

In some implementations, the input bits 501 are mapped to blocks in the pseudo triangular matrix 510 consecutively (by any suitable order). For example, the rows 521-536, in that order or in a reverse order, can be filled by the input bits 501 consecutively block-by-block, from the left-most block of a row to a right-most block of a row, or vice versa. In another example, the columns 541-556, in that order or in a reverse order, can be filled by the input bits 501 consecutively block-by-block, from the top-most block of a column to a bottom-most block of a row, or vice versa. In some implementations, the input bits 501 are mapped to the pseudo triangular matrix 510 pseudo-randomly. In other implementations, the input bits 501 can be mapped to the pseudo triangular matrix 510 using another suitable mapping mechanism.

The blocks, rows, and columns in the pseudo triangular matrix 510 can be grouped together. For example, the pseudo triangular matrix 510 includes a first group of columns 541-544, a second group of columns 545-548, a third group of columns 549-552, . . . , and another group of columns 553-556. The pseudo triangular matrix 510 includes a first group of rows 521-524, a second group of rows 525-528, a third group of rows 529-532, . . . , and another group of rows 533-536. Thus, the HFPC structure is divided into groups of 4 component codes. Every 4 component codes are encoded according to HFPC guidelines. Although 4 component code groups (e.g., 4 rows/columns) are shown in FIG. 5, any number (e.g., 2, 3, 6, 8, 10, 12, 16, and so on) of component codes can be grouped together.

As shown, the upper triangular form has a same number of columns and a same number of rows. The rows (e.g., the rows 521-524) or columns (e.g., the columns 541-544) in a same component code group have a same number of blocks and therefore have a same number of bits. In the upper triangular form, the rows 521-524 contain the most bits out of all the rows in the pseudo triangular matrix 510. Each of the rows 525-528 has one less group of blocks (4 blocks, corresponding to the group of columns 541-544) than any of the rows 521-524. Each of the rows 529-532 has one less group of blocks (4 blocks, corresponding to the group of columns 545-548) than any of the rows 525-528, and so on. Each of the rows 533-536, being the lowest row, has a group of blocks (e.g., 4 blocks). In other words, any row in the pseudo triangular matrix 510 (except for the rows 521-524) has 4 blocks less than a row of a group immediately above. Similarly, in the upper triangular form, each of the columns 541-544, being one of the left-most columns, has a group of blocks (e.g., 4 blocks). Each of the columns 545-548 has one more group of blocks (4 blocks, corresponding to the group of rows 525-528) than any of the columns 541-544. Each of the columns 549-552 has one more group of blocks (4 blocks, corresponding to the group of rows 529-532) than any of the columns 545-548, and so on. Each of the columns 553-556, being the right-most columns, has the most number of blocks. In other words, any column in the pseudo triangular matrix 510 (except for the columns 553-556) has 4 blocks less than a column of a group immediately to the right.

Organizing or mapping the input bits 501 in the upper triangular form of the pseudo triangular matrix 510 allows every component code to be associated with bits in a row and a column that have the same size or nearly the same size in the manner described. The component codes within a same group encode separate sets of the input bits 501 and are independent of each other.

R1 561-R4 564 are redundancy bits determined based on a same group of component codes. R1 561 represents redundancy bits corresponding to a first component code and are obtained by encoding (e.g., folded component encoding) the input bits 501 in a first row (e.g., the bits in the row 521). R2 562, R3 563, and R4 564 represent redundancy bits corresponding to additional component codes and are obtained by encoding (e.g., folded component encoding) the input bits 501 in the bits in the rows 522, 523, and 523, respectively. The bits used to determine each of R1 561-R4 564 do not overlap, and thus R1 561-R4 564 are independently determined.

R5 565, R6 566, R7 567, and R8 568 represent redundancy bits corresponding to additional component codes and are obtained by encoding (e.g., folded component encoding) the input bits 501 in the bits in the column 544 and row 525, in the column 543 and row 526, in the column 542 and row 527, and in the column 541 and row 528, respectively. The bits used to determine each of R5 565-R8 568 do not overlap, and thus R5 565-R8 568 are independently determined.

R9 569, R10 570, R11 571, and R12 572 represent redundancy bits corresponding to additional component codes and are obtained by encoding (e.g., folded component encoding) the input bits 501 in the bits in the column 548 and row 529, in the column 547 and row 530, in the column 546 and row 531, and in the column 545 and row 532, respectively. The bits used to determine each of R9 569-R12 572 do not overlap, and thus R9 569-R12 572 are independently determined.

This process continues until Rn-3 573, Rn-2 574, Rn-1 575, and Rn 576 are determined. Rn-3 573, Rn-2 574, Rn-1 575, and Rn 576 represent redundancy bits corresponding to additional component codes and are obtained by encoding (e.g., folded component encoding) the input bits 501 in the bits in the column 556, in the column 555, in the column 554, and in the column 553, respectively. The bits used to determine each of Rn-3 573, Rn-2 574, Rn-1 575, and Rn 576 do not overlap, and thus Rn-3 573, Rn-2 574, Rn-1 575, and Rn 576 are independently determined. An example of the folded component encoding is folded BCH encoding.

In the special case that the component codes are divided into two groups of independent component codes, the resulting coding scheme degenerates to a folded product code.

In other words, according to the mapping 500, the input bits 501 are mapped to the component codes of the ECC and are encoded as the mapped component codes. For example, the encoding process organizes or maps the input bits 501 in a matrix (e.g., a pseudo triangular matrix form), and performs folded BCH encoding for every component code. Each of the input bits 501 is encoded by two component codes of different component code groups. Thus, any component code intersects with all other component codes that are in the same group as the group to which that component code belongs. For component codes that encode the input bits 501, the encoding process is performed such that the systematic bits of every component code is also encoded by all other component codes that belong to different groups, with dependency within a component code group being eliminated. The input bits encoded by a given component code of the component codes are also encoded by every other component code (that is not in the same group as that component code) in a non-overlapping manner. For example, the bits encoded by the component code corresponding to R9 569 redundancy bits are also encoded by other component codes corresponding to R1 561-R8 568 and R11-Rn 576 that are not in the group in which the component code corresponding to R9 569 redundancy bits belongs. Each block of bits encoded by any of the component code (e.g., the component code corresponding to the R9 569) is encoded by that component code (e.g., the component code corresponding to the R9 569) and no more than another one of the component codes, hence in a non-overlapping manner. As such, every component code is mutually dependent on all other component codes that are not within the same group. The component codes together provide the encoding of each input bits 501 using two component codes.

In some implementations, parity bits can be generated via parity encoding. For example, folded parity encoding can be used to encode at least a portion of each of R1 561-Rn 576 into another component code (e.g., a folded product code 580, which is a set of packets). The folded product code 580 (e.g., having Rp1-Rp3) is the parity bits. This method of generating the parity bits can be efficient for obtaining simple hardware encoding implementations of HFPC, as the method can be iteratively decoded using various methods of hard or soft decoding.

Further disclosure with respect to decoding based on the ECC structure described herein is described in Application No. 16/355,555, titled "Error Correction Code Decoder," filed Mar. 15, 2019, which is hereby incorporated by reference in its entirety.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storages, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for encoding data having input bits to be stored in a non-volatile storage device, comprising:
    mapping, by a memory controller and in connection with a memory operation for the input bits in a memory array of the non-volatile storage device, the input bits to a plurality of blocks, each block of the plurality of blocks comprising a separate subset of two or more of the input bits, wherein the plurality of blocks are associated with a plurality of component codes of an error correction code (ECC); and
    encoding, by the memory controller, only the input bits associated with the memory operation as the plurality of component codes, wherein the mapping and encoding are performed such that each component code is generated using a respective different set of the plurality of blocks, while each block of the input bits is encoded by both of two of the plurality of component codes.

2. The method of claim 1, wherein the input bits comprise information bits and a signature, the method further comprising generating the signature from the information bits, wherein the signature is used during decoding to check whether decoding of the information bits is successful.

3. The method of claim 2, wherein the signature is a cyclic redundancy check-sum (CRC).

4. The method of claim 1, wherein mapping the input bits to the plurality of component codes comprises mapping the input bits to a pseudo triangular matrix.

5. The method of claim 4, wherein
    the pseudo triangular matrix comprises a plurality of the blocks and
    each of the plurality of blocks comprises a same number of two or more of the input bits.

6. The method of claim 5, wherein any two of the plurality of component codes have one or more of the input bits in common.

7. The method of claim 4, wherein mapping the input bits to the pseudo triangular matrix comprises mapping the input bits to rows and columns of the pseudo triangular matrix.

8. The method of claim 7, wherein the input bits are mapped to the rows and the columns of the pseudo triangular matrix pseudorandomly.

9. The method of claim 7, further comprising generating redundancy bits of the component codes based on the rows and the columns of the pseudo triangular matrix.

10. The method of claim 9, wherein generating redundancy bits of the component codes based on the rows and the columns of the pseudo triangular matrix comprises:
generating first ones of the redundancy bits using the input bits in a first one of the rows and a first one of the columns;
generating second ones of the redundancy bits using the input bits in a second one of the rows and a second one of the columns; and
every one of the rows is used to determine a corresponding one of the redundancy bits.

11. The method of claim 1, further comprising;
generating redundancy bits of the component codes based on the mapping; and
generating parity bits of a folded product code, wherein the parity bits are generated based on the redundancy bits using folded parity encoding.

12. The method of claim 11, wherein an incomplete portion of each of the redundancy bits is used to generate the parity bits of the folded product code.

13. The method of claim 1, wherein the input bits comprise a protected portion, and the method further comprising encoding the protected portion using a second plurality of component codes, wherein the plurality of component codes is different form the second plurality of component codes.

14. The method of claim 13, further comprising:
generating first redundancy bits for the input bits based on the plurality of component codes; and
generating second redundancy bits for the protected portion based on the second plurality of component codes.

15. The method of claim 14, further comprising generating parity bits of a folded product code based on the first redundancy bits and the second redundancy bits using folded parity encoding.

16. The method of claim 1, wherein the plurality of component codes is Bose-Chaudhuri-Hocquenghem (BCH) error correcting codes.

17. A method for encoding data having input bits to be stored in a non-volatile storage device, comprising:
mapping, by a memory controller and in connection with a memory operation for the input bits in a memory array of the non-volatile storage device, the input bits to a plurality of blocks, each block of the plurality of blocks comprising a separate subset of two or more of the input bits, wherein the plurality of blocks are associated with a plurality of component codes of an error correction code (ECC);
grouping, by the memory controller, the plurality of component codes into groups of two or more component codes, wherein a first group of the groups comprises a first component code; and
encoding, by the memory controller, only the input bits associated with the memory operation as the plurality of component codes, wherein the mapping and encoding are performed such that each component code is generated using a respective different set of the plurality of blocks, while each block of the input bits is encoded by both of two of the plurality of component codes, and wherein a first block of the input bits encoded by the first component code is also encoded by every other component code of the plurality of component codes that are in groups other than the first group.

18. The method of claim 17, wherein component codes within a same one of the groups are independent of each other, and the component codes within the same one of the groups encode different ones of the input bits.

19. A non-volatile storage device, comprising:
a memory array; and
a controller configured to encode data having input bits to be stored in connection with a memory operation on the memory array of the non-volatile storage device by:
mapping the input bits to a plurality of blocks, each block of the plurality of blocks comprising a separate subset of two or more of the input bits, wherein the plurality of blocks are associated with a plurality of component codes of an error correction code (ECC); and
encoding only the input bits associated with the memory operation as the plurality of component codes, wherein the mapping and encoding are performed such that each component code is generated using a respective different set of the plurality of blocks, while each block of the input bits is encoded by both of two of the plurality of component codes.

20. A non-transitory computer-readable medium storing computer-readable instructions, such that when executed, causes a controller of a non-volatile storage device to:
map the input bits to a plurality of blocks, each block of the plurality of blocks comprising a separate subset of two or more of the input bits, wherein the plurality of blocks are associated with a plurality of component codes of an error correction code (ECC) in connection with a memory operation for the input bits in a memory array of the non-volatile storage device; and
encode only the input bits associated with the memory operation as the plurality of component codes, wherein the mapping and encoding are performed such that each component code is generated using a respective different set of the plurality of blocks, while each block of the input bits is encoded by both of two of the plurality of component codes.

* * * * *